(12) United States Patent
Ghosh et al.

(10) Patent No.: US 11,078,568 B2
(45) Date of Patent: Aug. 3, 2021

(54) PUMPING APPARATUS AND METHOD FOR SUBSTRATE PROCESSING CHAMBERS

(71) Applicant: Applied Materials, Inc., Santa Clara, CA (US)

(72) Inventors: Kalyanjit Ghosh, Pleasanton, CA (US); David Blahnik, Austin, TX (US); Amit Kumar Bansal, Milpitas, CA (US); Tuan Anh Nguyen, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 115 days.

(21) Appl. No.: 16/685,340

(22) Filed: Nov. 15, 2019

(65) Prior Publication Data
US 2020/0216952 A1    Jul. 9, 2020

Related U.S. Application Data

(60) Provisional application No. 62/826,407, filed on Mar. 29, 2019, provisional application No. 62/789,905, filed on Jan. 8, 2019.

(51) Int. Cl.
*C23C 16/44* (2006.01)

(52) U.S. Cl.
CPC .................. *C23C 16/4412* (2013.01)

(58) Field of Classification Search
CPC .......... C23C 16/4412; C23C 16/45591; C23C 16/4586; C23C 16/5096
(Continued)

(56) References Cited

U.S. PATENT DOCUMENTS 5,338,363 A * 8/1994 Kawata ............. C23C 16/45512
                                                                118/715
5,441,568 A * 8/1995 Oho .................... C23C 16/4412
                                                                118/715
(Continued)

FOREIGN PATENT DOCUMENTS

CN    102763199 A    10/2012
JP    H1136076 A     2/1999
(Continued)

OTHER PUBLICATIONS

International Search Report and Written Opinion dated Mar. 9, 2020 for Application No. PCT/US2019/061656.
(Continued)

*Primary Examiner* — Rudy Zervigon
(74) *Attorney, Agent, or Firm* — Patterson + Sheridan, LLP

(57) ABSTRACT

The present disclosure relates to pumping devices, components thereof, and methods associated therewith for substrate processing chambers. In one example, a pumping ring for substrate processing chambers includes a body. The body includes an upper wall, a lower wall, an inner radial wall, and an outer radial wall. The pumping ring also includes an annulus defined by the upper wall, the lower wall, the inner radial wall, and the outer radial wall. The pumping ring also includes a first exhaust port in the body that is fluidly coupled to the annulus, and a second exhaust port in the body that is fluidly coupled to the annulus. The pumping ring also includes a first baffle disposed in the annulus adjacent to the first exhaust port, and a second baffle disposed in the annulus adjacent to the second exhaust port.

20 Claims, 6 Drawing Sheets

FIG. 1E

(58) Field of Classification Search
USPC .......... 118/715, 728, 50; 156/345.1, 345.29, 156/345.33, 345.34, 345.35, 345.36, 156/345.26, 345.51
See application file for complete search history.

(56) References Cited

U.S. PATENT DOCUMENTS

| | | | | |
|---|---|---|---|---|
| 5,895,530 | A * | 4/1999 | Shrotriya | C23C 16/4412 118/715 |
| 6,261,408 | B1 * | 7/2001 | Schneider | C23C 16/4412 118/715 |
| 6,531,069 | B1 * | 3/2003 | Srivastava | H01J 37/3244 118/723 R |
| 6,777,352 | B2 * | 8/2004 | Tepman | C23C 16/4412 118/696 |
| 6,806,211 | B2 * | 10/2004 | Shinriki | C23C 16/40 118/715 |
| 6,890,596 | B2 * | 5/2005 | Sarigiannis | C23C 16/4401 134/1.1 |
| 7,020,981 | B2 * | 4/2006 | Shero | C23C 16/4412 118/715 |
| 7,273,526 | B2 * | 9/2007 | Shinriki | C23C 16/34 118/715 |
| 7,390,366 | B2 * | 6/2008 | Shim | C23C 16/4401 118/715 |
| 7,468,104 | B2 * | 12/2008 | Mardian | C23C 16/4401 118/715 |
| 7,905,959 | B2 * | 3/2011 | Tzu | C23C 16/45561 118/715 |
| 8,048,226 | B2 * | 11/2011 | Vukovic | H01L 21/68735 118/715 |
| 8,282,768 | B1 * | 10/2012 | Smargiassi | H01L 21/02348 156/345.33 |
| 8,506,713 | B2 * | 8/2013 | Takagi | C23C 16/45574 118/715 |
| 8,512,472 | B2 * | 8/2013 | Vatus | C23C 16/45504 118/715 |
| 8,591,656 | B2 * | 11/2013 | Sakurai | H01L 21/68771 118/728 |
| 9,028,648 | B1 * | 5/2015 | Kamakura | C23C 16/52 156/345.29 |
| 9,449,859 | B2 * | 9/2016 | Song | C23C 16/4411 |
| 9,673,092 | B2 * | 6/2017 | Nakano | C23C 16/45544 |
| 9,732,421 | B2 * | 8/2017 | Kamakura | C23C 16/46 |
| 9,758,870 | B2 * | 9/2017 | Je | H01L 21/67103 |
| 9,779,918 | B2 * | 10/2017 | Lee | C23C 16/4412 |
| 9,837,250 | B2 * | 12/2017 | Huston | H01J 37/32522 |
| 9,909,214 | B2 * | 3/2018 | Suemori | H01J 37/32082 |
| 9,963,782 | B2 * | 5/2018 | Tsuji | H01J 37/32091 |
| 10,145,012 | B2 * | 12/2018 | Je | C23C 16/52 |
| 10,157,755 | B2 | 12/2018 | Chandrasekharan et al. | |
| 10,541,145 | B2 * | 1/2020 | Ogawa | H01L 21/31116 |
| 10,612,141 | B2 * | 4/2020 | Takahashi | C23C 16/45544 |
| 10,711,347 | B2 * | 7/2020 | DuBois | C23C 16/45536 |
| 10,808,315 | B2 * | 10/2020 | Seo | H01L 21/68771 |
| 10,954,596 | B2 * | 3/2021 | Polyak | C23C 16/45565 |
| 2001/0004478 | A1 | 6/2001 | Zhao et al. | |
| 2001/0050233 | A1 | 12/2001 | Uzoh et al. | |
| 2002/0025657 | A1 | 2/2002 | Anderson et al. | |
| 2004/0026037 | A1 * | 2/2004 | Shinriki | C23C 16/45563 156/345.33 |
| 2004/0071874 | A1 * | 4/2004 | Shimizu | C23C 16/45572 427/248.1 |
| 2004/0071897 | A1 * | 4/2004 | Verplancken | C23C 16/45542 427/569 |
| 2004/0144311 | A1 * | 7/2004 | Chen | C23C 16/45561 118/715 |
| 2004/0250765 | A1 * | 12/2004 | Ishizaka | C23C 16/34 118/715 |
| 2005/0208217 | A1 * | 9/2005 | Shinriki | H01J 37/32449 427/248.1 |
| 2007/0107653 | A1 | 5/2007 | Yamada | |
| 2007/0221130 | A1 * | 9/2007 | Nozawa | C23C 16/4412 118/719 |
| 2007/0281084 | A1 | 12/2007 | Hirosawa et al. | |
| 2008/0152803 | A1 * | 6/2008 | Lamouroux | C23C 16/45578 427/248.1 |
| 2008/0202423 | A1 * | 8/2008 | Hatanaka | C23C 16/38 118/723 VE |
| 2008/0318417 | A1 * | 12/2008 | Shinriki | C23C 16/36 438/650 |
| 2009/0084317 | A1 | 4/2009 | Wu et al. | |
| 2009/0165713 | A1 * | 7/2009 | Kim | C23C 16/45504 118/719 |
| 2009/0203223 | A1 * | 8/2009 | Suzuki | H01L 21/68757 438/778 |
| 2009/0260569 | A1 * | 10/2009 | Kim | C23C 16/45585 118/715 |
| 2010/0048022 | A1 * | 2/2010 | Kubota | H01L 21/02115 438/694 |
| 2010/0279008 | A1 * | 11/2010 | Takagi | C23C 16/4557 427/248.1 |
| 2011/0162580 | A1 * | 7/2011 | Provencher | F16K 27/003 118/715 |
| 2011/0207299 | A1 * | 8/2011 | Sakurai | H01L 21/67253 438/478 |
| 2011/0290419 | A1 * | 12/2011 | Horiguchi | H01J 37/32651 156/345.29 |
| 2012/0009765 | A1 * | 1/2012 | Olgado | C23C 16/45508 438/478 |
| 2012/0024449 | A1 * | 2/2012 | Ricci | H01J 37/32477 156/60 |
| 2012/0146191 | A1 * | 6/2012 | Yasuhara | H01L 21/0254 257/615 |
| 2012/0222813 | A1 * | 9/2012 | Pal | C23C 16/4412 156/345.31 |
| 2013/0143393 | A1 * | 6/2013 | Yasuhara | H01L 21/0254 438/478 |
| 2014/0235069 | A1 * | 8/2014 | Breiling | C23C 16/452 438/778 |
| 2015/0056108 | A1 | 2/2015 | Gytri et al. | |
| 2015/0187545 | A1 * | 7/2015 | Lee | H01J 37/32834 216/67 |
| 2016/0002788 | A1 | 1/2016 | Nal et al. | |
| 2016/0083837 | A1 * | 3/2016 | Narushima | H01L 21/68792 118/725 |
| 2016/0153088 | A1 * | 6/2016 | Tsuji | C23C 16/4412 118/728 |
| 2016/0194756 | A1 * | 7/2016 | Lim | C23C 16/4412 118/715 |
| 2016/0237559 | A1 * | 8/2016 | Tsuji | C23C 16/4412 |
| 2016/0289831 | A1 * | 10/2016 | Je | C23C 16/4412 |
| 2016/0355928 | A1 * | 12/2016 | Toriya | H01L 21/02175 |
| 2017/0051402 | A1 * | 2/2017 | Mori | H01J 37/32715 |
| 2018/0163305 | A1 * | 6/2018 | Batzer | H01J 37/3244 |
| 2018/0305815 | A1 * | 10/2018 | Seo | H01L 21/68771 |
| 2018/0320266 | A1 | 11/2018 | Nal et al. | |
| 2019/0122872 | A1 | 4/2019 | Ghosh et al. | |
| 2019/0273004 | A1 * | 9/2019 | Ueda | H01L 21/67017 |
| 2020/0032396 | A1 * | 1/2020 | Polyak | C23C 16/45544 |
| 2020/0075297 | A1 * | 3/2020 | Oishi | B08B 7/0071 |

FOREIGN PATENT DOCUMENTS

| | | |
|---|---|---|
| JP | 2010263112 A | 11/2010 |
| KR | 101535155 B1 | 7/2015 |
| WO | 02052069 A1 | 7/2002 |

OTHER PUBLICATIONS

International Search Report and Written Opinion dated Sep. 23, 2020 for Application No. PCT/US2020/036801.

* cited by examiner

PUMPING APPARATUS AND METHOD FOR SUBSTRATE PROCESSING CHAMBERS

CROSS-REFERENCE TO RELATED APPLICATIONS

This application claims benefit of U.S. provisional patent application Ser. No. 62/826,407, filed Mar. 29, 2019, and U.S. provisional patent application Ser. No. 62/789,905, filed Jan. 8, 2019; each of which is herein incorporated by reference.

BACKGROUND

Field

Aspects of the present disclosure relate generally to pumping devices, components thereof, and methods associated therewith for substrate processing chambers.

Description of the Related Art

Fluids in substrate processing chambers sometimes need to be exhausted either during or after substrate processing operations, such as chemical vapor deposition (CVD) operations. However, evacuation of the fluids around a substrate is sometimes not symmetrical, which can lead to non-uniform processing and formation of residue in the chamber that can have harmful effects on operations. Residue can flake off onto substrates during processing, causing defects in the substrates.

Efforts to make fluid evacuation more symmetrical have resulted in decreased pumping exhaust flow rates, affecting the timeline of operations and throughput of the overall processing systems. Efforts have also resulted in designs that are limited by other components in or around the substrate processing chambers, causing changes to the sizes and/or configurations of components of the chambers.

Therefore, there is a need for a pumping device that increases symmetry of exhaust operations and maintains pumping capacity.

SUMMARY

Implementations of the present disclosure generally relate to pumping devices for substrate processing chambers.

In one example, a pumping ring for substrate processing chambers includes a body. The body includes an upper wall, a lower wall, an inner radial wall, and an outer radial wall. The pumping ring also includes an annulus defined by the upper wall, the lower wall, the inner radial wall, and the outer radial wall. The pumping ring also includes a first exhaust port in the body that is fluidly coupled to the annulus, and a second exhaust port in the body that is fluidly coupled to the annulus. The pumping ring also includes a first baffle disposed in the annulus adjacent to the first exhaust port, and a second baffle disposed in the annulus adjacent to the second exhaust port.

In one example, a pumping ring for substrate processing chambers includes a body having a top surface, an upper wall, a lower wall, an inner radial wall, and an outer radial wall. The pumping ring also includes one or more openings in the body that are configured to direct a fluid therethrough. The pumping ring also includes a first exhaust port in the body and a second exhaust port in the body.

In one example, a substrate processing chamber includes a chamber body, a pedestal disposed in the chamber body, and a pumping ring disposed around the pedestal. The pumping ring has an upper wall, a lower wall, an inner radial wall, and an outer radial wall. An annulus is defined by the upper wall, the lower wall, the inner radial wall, and the outer radial wall. The substrate processing chamber also includes a first exhaust port in the pumping ring that is fluidly coupled to the annulus, and a second exhaust port in the pumping ring that is fluidly coupled to the annulus. The substrate processing chamber also includes a foreline that is fluidly coupled to the first exhaust port and the second exhaust port.

BRIEF DESCRIPTION OF THE DRAWINGS

So that the manner in which the above recited features of the disclosure can be understood in detail, a more particular description of the disclosure, briefly summarized above, may be had by reference to implementations, some of which are illustrated in the appended drawings. It is to be noted, however, that the appended drawings illustrate only common implementations of this disclosure and are therefore not to be considered limiting of its scope, for the disclosure may admit to other equally effective implementations.

Figure 1A:
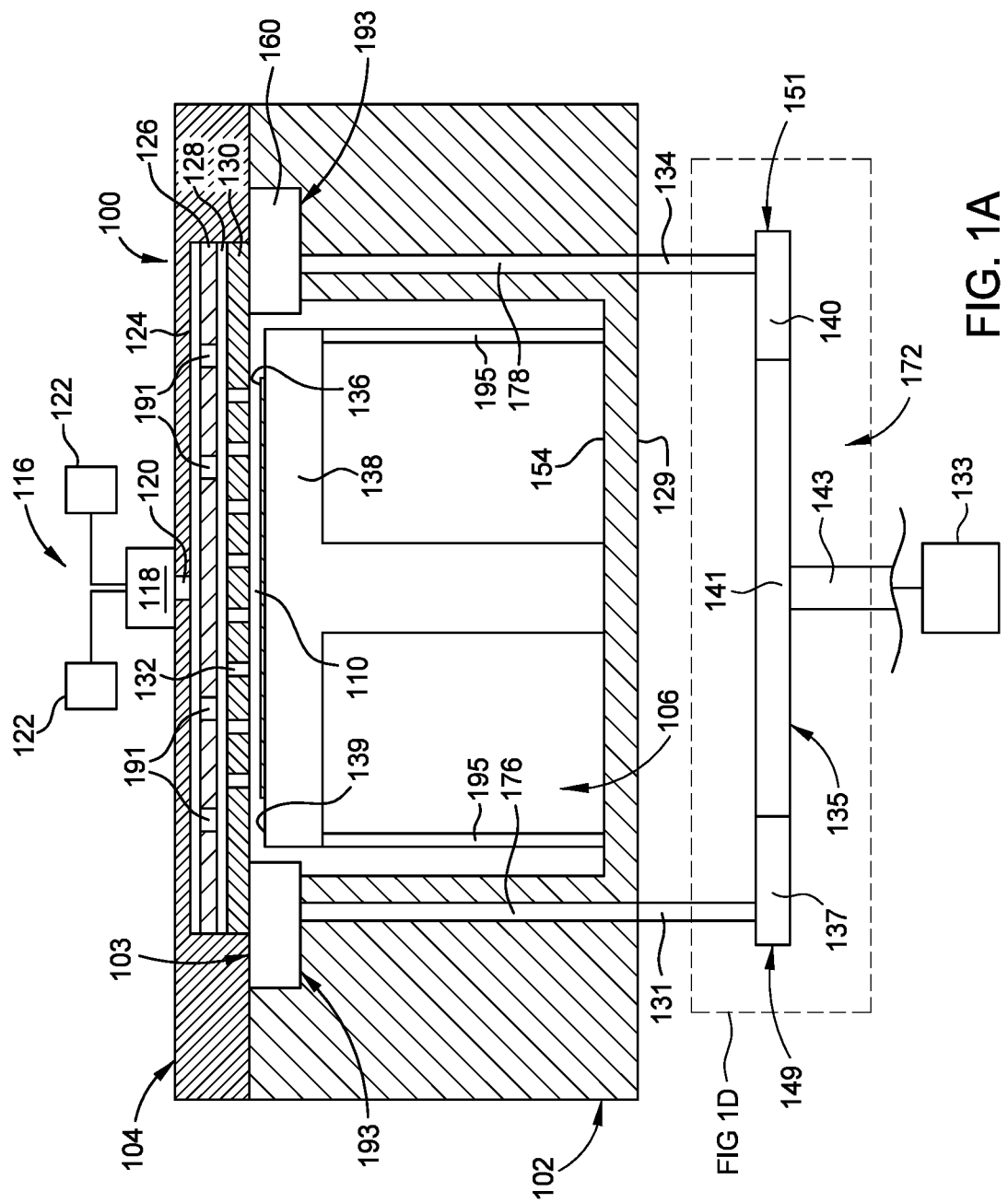
FIG. 1A is a schematic cross-sectional view of a substrate processing chamber, according to one implementation.

To facilitate understanding, identical reference numerals have been used, where possible, to designate identical elements that are common to the FIGURES. It is contemplated that elements disclosed in one implementation may be beneficially utilized on other implementations without specific recitation.

DETAILED DESCRIPTION

The present disclosure relates to pumping devices, components thereof, and methods associated therewith for substrate processing chambers.

FIG. 1A is a schematic cross-sectional view of a substrate processing chamber 100, according to one implementation.

The substrate processing chamber 100 may be, for example, a chemical vapor deposition (CVD) chamber or a plasma enhanced CVD chamber. The substrate processing chamber 100 has a chamber body 102 and a chamber lid 104. The chamber body 102 includes an internal volume 106 therein. The internal volume 106 is the space defined by the chamber body 102 and the chamber lid 104.

The substrate processing chamber 100 includes a gas distribution assembly 116 coupled to or disposed in the chamber lid 104 to deliver a flow of one or more gases into a processing region 110. The gas distribution assembly 116 includes a gas manifold 118 coupled to a gas inlet passage 120 formed in the chamber lid 104. The gas manifold 118 receives a flow of gases from one or more gas sources 122 (two are shown). The flow of gases received from the one or more gas sources 122 distributes across a gas box 124, flows through a plurality of openings 191 of a backing plate 126, and further distributes across a plenum 128 defined by the backing plate 126 and a faceplate 130. The flow of gases then flows into a processing region 110 of the internal volume 106 through a plurality of openings 132 of the faceplate 130.

The internal volume 106 includes a pedestal 138 disposed in the chamber body 102. The pedestal 138 supports a substrate 136 within the substrate processing chamber 100. The pedestal 138 supports the substrate 136 on a support surface 139 of the pedestal 138. The pedestal 138 includes a heater and an electrode disposed therein. The electrode may supply direct current (DC) voltage, radio frequency (RF) energy, or alternating current (AC) energy to the internal volume 106 and/or the processing region 110.

The pedestal 138 is movably disposed in the internal volume 106 by a lift system 195. Movement of the pedestal 138 facilitates transfer of the substrate 136 to and from the internal volume 106 through a slit valve formed through the chamber body 102. The pedestal 138 may also be moved to different processing positions for processing of the substrate 136.

During substrate processing, as gases flow through the plurality of openings 132 and into the processing region 110, a heater heats the pedestal 138 and the support surface 139. Also during substrate processing, the electrode in the pedestal 138 propagates radio frequency (RF) energy, alternating current (AC), or direct current (DC) voltage to facilitate plasma generation in the processing region 110 and/or to facilitate chucking of the substrate 136 to the pedestal 138. The heat, gases, and energy from the electrode in the pedestal 138 facilitate deposition of a film onto the substrate 136 during substrate processing. The faceplate 130 (which is grounded via coupling to the chamber body 102) and the electrode of the pedestal 138 facilitate formation of a capacitive plasma coupling. When power is supplied to the electrode in the pedestal 138, an electric field is generated between the faceplate 130 and pedestal 138 such that atoms of gases present in the processing region 110 between the pedestal 138 and the faceplate 130 are ionized and release electrons. The ionized atoms accelerate to the pedestal 138 to facilitate film formation on the substrate 136.

A pumping device 103 is disposed in the substrate processing chamber 100. The pumping device 103 facilitates removal of gases from the internal volume 106 and processing region 110. The gases exhausted by the pumping device 103 include one or more of a processing gas and/or a processing residue. The processing residue may result from the process of depositing a film onto the substrate 136.

The pumping device 103 includes a pumping ring 160 disposed on a stepped surface 193 of the chamber body 102. The stepped surface 193 is stepped upwards from a bottom surface 154 of the chamber body 102. The stepped surface 193 supports the pumping ring 160. The pumping ring 160 includes a body 107 (shown in FIG. 1B). The body 107 of the pumping ring 160 is made from material including one or more of aluminum, aluminum oxide, and/or aluminum nitride. The pumping ring 160 is fluidly coupled to a foreline 172 through a first conduit 176 and a second conduit 178. The foreline 172 includes a first vertical conduit 131, a second vertical conduit 134, a horizontal conduit 135, and an exit conduit 143. The exit conduit 143 in one example is a third vertical conduit. In one example, the first conduit 176 and the second conduit 178 are openings formed in the chamber body 102 and extend from the stepped surface 193 to a lower outer surface 129 of the chamber body 102. The present disclosure contemplates that the first conduit 176 and the second conduit 178 could be tubes are other flow devices that extend between a surface of the chamber body 102, such as the bottom surface 154, and the pumping ring 160. As an example, the first conduit 176 and the second conduit 178 could be part of the first vertical conduit 131 and the second vertical conduit 134, respectively. In such an example, the first vertical conduit 131 and the second vertical conduit 134 may extend through the chamber body 102 and be coupled to the pumping ring 160.

The first conduit 176 is fluidly coupled to the pumping ring 160 at a first end and the first vertical conduit 131 of the foreline 172 at a second end. The second conduit 178 is fluidly coupled to the pumping ring 160 at a first end and the second vertical conduit 134 of the foreline 172 at a second end. The first vertical conduit 131 and the second vertical conduit 134 are fluidly coupled to the horizontal conduit 135. The horizontal conduit 135 includes a first portion 137 coupled to the first vertical conduit 131, a second portion 140 coupled to the second vertical conduit 134, and a third portion 141 coupled to the exit conduit 143. The horizontal conduit 135 includes a first end 149 adjacent to the first vertical conduit 131 and a second end 151 adjacent to the second vertical conduit 134. The horizontal conduit 135 can be made up of a single body or can be fabricated from one or more components.

The first conduit 176, second conduit 178, first vertical conduit 131, second vertical conduit 134, and horizontal conduit 135 are configured to direct gases therethrough. The present disclosure contemplates that the first conduit 176, second conduit 178, first vertical conduit 131 and second vertical conduit 134 need not be completely vertical and may be angled or may include one or more bends and/or angles. The present disclosure also contemplates that the horizontal conduit 135 need not be completely horizontal and may be angled or may include one or more bends and/or angles.

In one embodiment, which can be combined with other embodiments, the pumping ring 160 is disposed inside of the chamber body 102 while the first vertical conduit 131, the second vertical conduit 134, the horizontal conduit 135, and the exit conduit 143 are disposed or extend outside of the chamber body 102. In such an embodiment, the first conduit 176 and the second conduit 178 are disposed through the chamber body 102.

The exit conduit 143 is fluidly coupled to a vacuum pump 133 to control the pressure within the processing region 110 and to exhaust gases and residue from the processing region 110. The vacuum pump 133 exhausts gases from the processing region 110 through the pumping ring 160, the first conduit 176, the second conduit 178, the first vertical conduit 131, the second vertical conduit 134, the horizontal conduit 135, and the exit conduit 143 of the foreline 172.

Figure 1B:
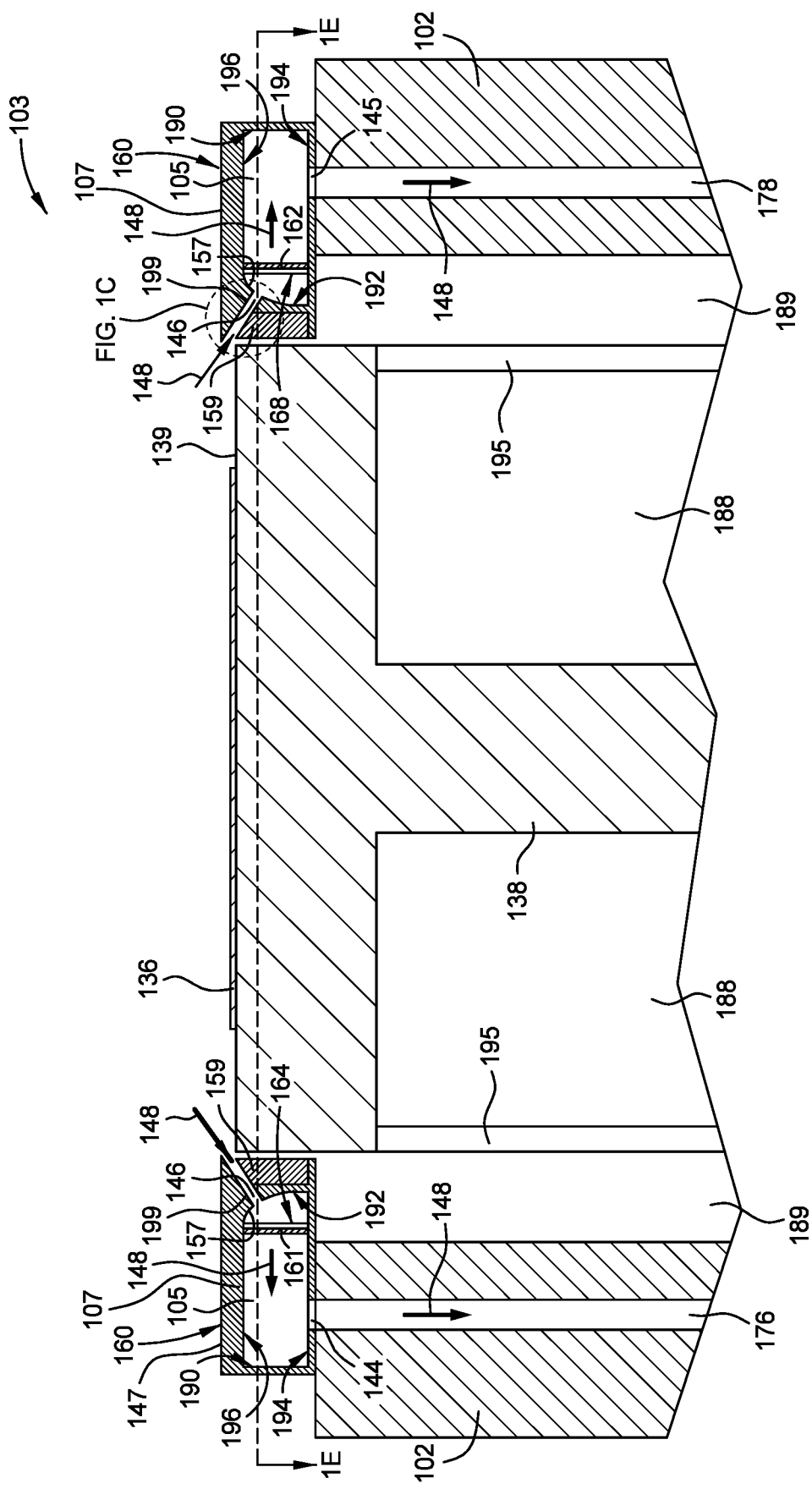
FIG. 1B is an enlarged schematic cross-sectional partial view of the substrate processing chamber illustrated in FIG. 1A, according to one implementation.

FIG. 1B is an enlarged schematic cross-sectional partial view of the substrate processing chamber 100 illustrated in FIG. 1A, according to one implementation. The pumping ring 160 is disposed around the pedestal 138. The support surface 139 is configured to support a substrate 136 thereon. The body 107 of the pumping ring 160 includes an upper wall 196, a lower wall 194, an inner radial wall 192, and an outer radial wall 190. An annulus 105 of the pumping ring 160 is defined by the upper wall 196, lower wall 194, inner radial wall 192, and outer radial wall 190. The pumping ring 160 includes a curved portion 157 adjacent to the inner radial wall 192 and the upper wall 196. An optional insulator ring 159 is disposed between the pumping ring 160 and the pedestal 138. There can optionally be a space 188 between the pedestal 138 and the lift system 195, and optionally a space 189 between the lift system 195 and the chamber body 102. The optional spaces 188 and 189 may be eliminated. The spaces 188 and/or 189 may be occupied partially or fully by the pedestal 138, the pumping ring 160, the chamber body 102 and/or any other component or material. The present disclosure contemplates that the pumping ring 160 may be formed of a single body, or may be formed of multiple components.

The pumping ring 160 includes one or more openings 146 in an upper portion 199 of the body 107. The present disclosure contemplates that the one or more openings 146 can be in another portion of the pumping ring 160, such as a bottom portion of the body 107. The one or more openings 146 are configured to direct fluid 148, such as processing gases and processing residue, from the processing region 110 and the internal volume 106 into the annulus 105. The one or more openings 146 are illustrated in FIG. 1B as angled and directed downward and radially outward relative to the processing region 110 and/or the pedestal 138. The one or more openings 146 extend from a top surface 147 and through the curved portion 157 of the body 107. The present disclosure contemplates that the one or more openings 146 can be linear or angled, and can be disposed vertically or horizontally. The one or more openings 146 can be disposed anywhere in the top surface 147 of the pumping ring 160. The location(s), size(s), shape(s), and/or depth(s) of the one or more openings 146 can be modified based on process requirements and/or exhaust requirements. The angled orientation of the one or more openings 146 illustrated in FIG. 1B facilitates uniform deposition of film onto substrate 136 and uniform exhaustion of fluid 148. As an example, the angled orientation of the one or more openings 146 can elongate the depth of the one or more openings 146, tune backpressure, and provide additional expansion volume for fluid 148. The angled orientation can also reduce or eliminate the buildup of pressure gradients and/or velocity gradients for the fluid 148 in the pumping ring 160, thereby facilitating uniform exhaustion of fluid 148 and uniform deposition onto substrate 136. The fluid 148 includes one or more of processing gases, processing residue, and/or purge gases.

The pumping ring 160 includes a first exhaust port 144 and a second exhaust port 145 in the body 107. The first exhaust port 144 and the second exhaust port 145 are disposed radially outside of the support surface 139 of the pedestal 138. The first exhaust port 144 and the second exhaust port 145 are fluidly coupled to the annulus 105. The first exhaust port 144 is fluidly coupled to the first vertical conduit 131 through the first conduit 176. The first exhaust port 144 is configured to direct fluid 148 from the annulus 105 and into the first conduit 176. The second exhaust port 145 is fluidly coupled to the second vertical conduit 134 through the second conduit 178. The second exhaust port 145 is configured to direct fluid 148 from the annulus 105 and into the second conduit 178. The first exhaust port 144 and the second exhaust port 145 are disposed on opposite sides of the pumping ring 160. For example, the first exhaust port 144 and the second exhaust port 145 are about 180 degrees from one another.

The pumping ring 160 includes a first baffle 161 adjacent to and radially inward of the first exhaust port 144. The pumping ring 160 also includes a second baffle 162 adjacent to and radially inward of the second exhaust port 145. The first baffle 161 and the second baffle 162 are disposed in the annulus 105. The first baffle 161 is disposed between the first exhaust port 144 and the inner radial wall 192 of the pumping ring 160. The second baffle 162 is disposed between the second exhaust port 145 and the inner radial wall 192 of the pumping ring 160. In one embodiment, which can be combined with other embodiments, the first baffle 161 and the second baffle 162 are coupled to the upper wall 196 and the lower wall 194 of the pumping ring 160. The first baffle 161 and the second baffle 162 may be formed as a single body with the body 107 of the pumping ring 160.

Figure 1C:
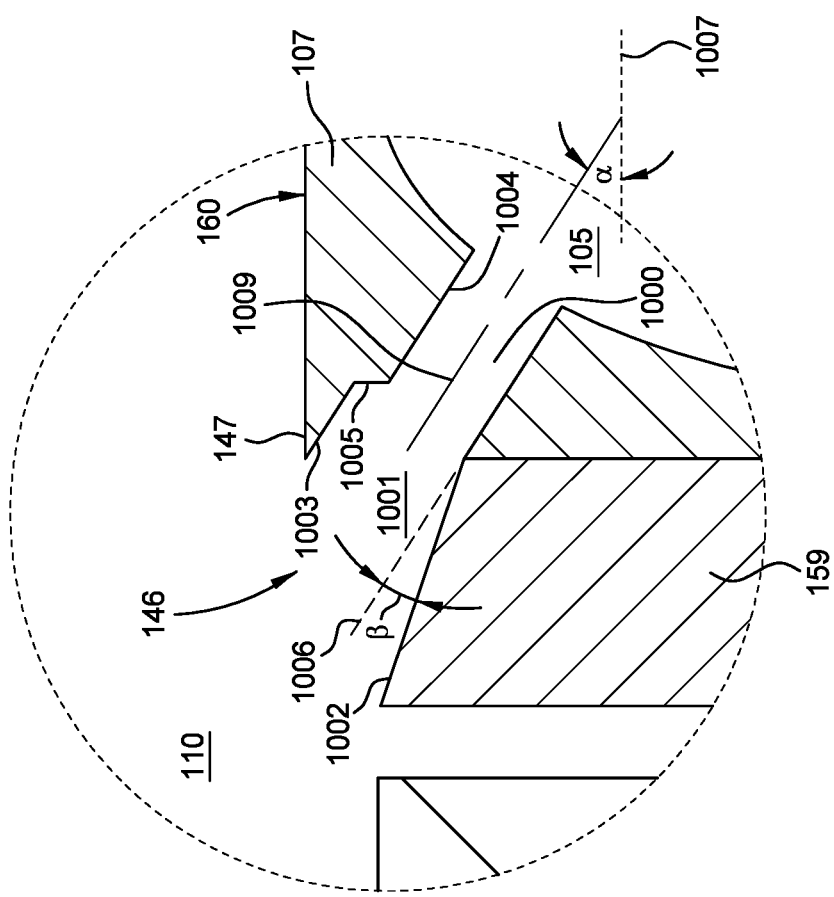
FIG. 1C is an enlarged schematic cross-sectional partial view of the substrate processing chamber illustrated in FIG. 1B, according to one implementation.

FIG. 1C is an enlarged schematic cross-sectional partial view of the substrate processing chamber 100 illustrated in FIG. 1B, according to one implementation. Each of the one or more openings 146 includes a first portion 1000 that opens up to the annulus 105 of the pumping ring 160 and a second portion 1001 that is between the first portion 1000 and the processing region 110. The first portion 1000 is between the second portion 1001 and the annulus 105. The second portion 1001 is wider than the first portion 1000. The second portion 1001 is necked down towards the first portion 1000. The second portion 1001 is defined by a tapered surface 1002 of the insulator ring 159 and a recessed surface 1003 of the pumping ring 160. The recessed surface 1003 is disposed radially outside of an inner surface 1004 defined by the first portion 1000 of the respective opening 146. A shoulder 1005 is between the recessed surface 1003 and the inner surface 1004. The tapered surface 1002 intersects a linear profile 1006 of the inner surface 1004 at an angle β such that the tapered surface 1002 is not coplanar with the inner surface 1004. In one example, the first portion 1000 is circular in shape and the second portion 1001 is conical in shape.

At least the first portion 1000 of the opening 146 is disposed at an angle relative to a horizontal axis 1007. The first portion 1000 is disposed such that a centerline axis 1009 of the first portion 1000 is at an angle α relative to the horizontal axis 1007. In one example, the angle α is within a range of −90 degrees to 90 degrees, such as −45 degrees to 45 degrees. In one example, the angle α is 45 degrees.

Figure 1D:
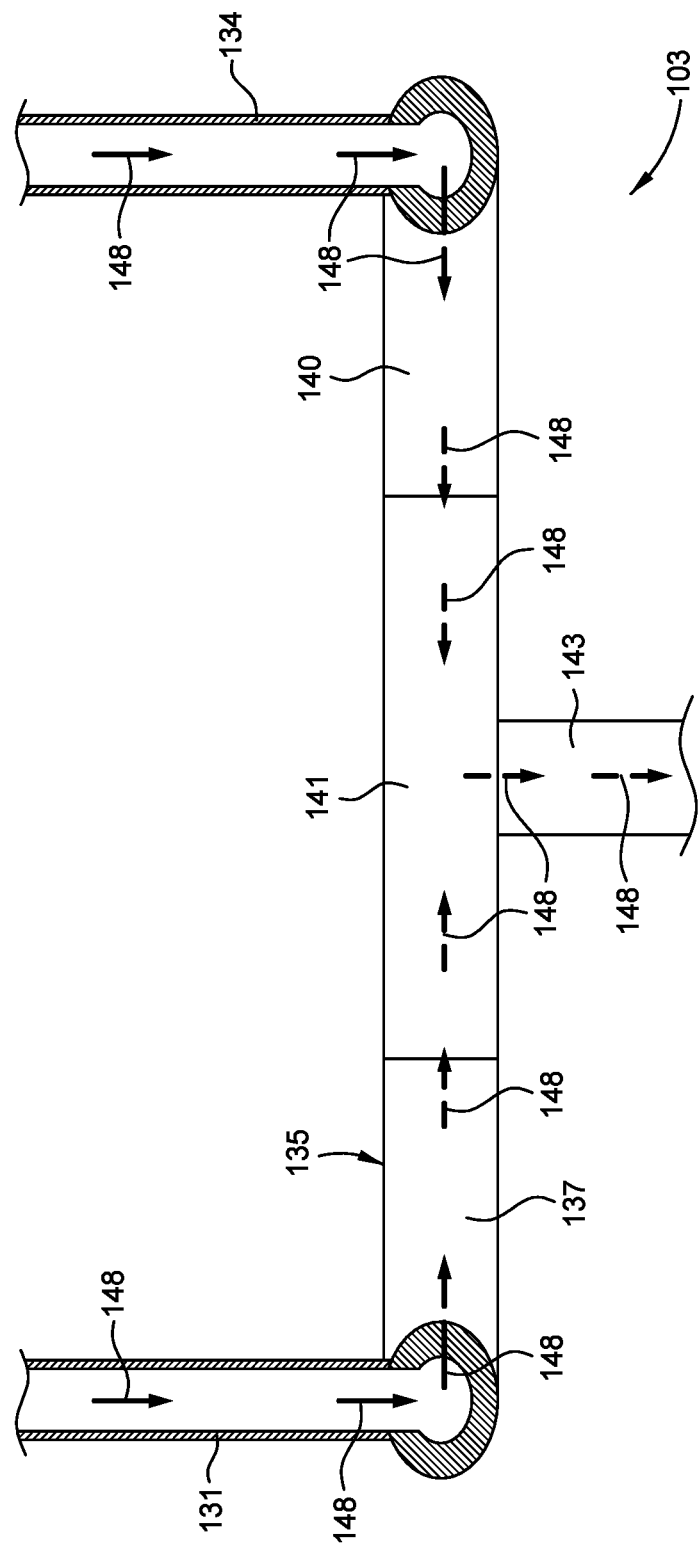
FIG. 1D is an enlarged schematic cross-sectional partial view of the pumping device illustrated in FIG. 1A, according to one implementation.

FIG. 1D is an enlarged schematic cross-sectional partial view of the pumping device 103 illustrated in FIG. 1A, according to one implementation. The first exhaust port 144 is fluidly coupled to the exit conduit 143 through the first conduit 176, the first vertical conduit 131, and the horizontal conduit 135. The second exhaust port 145 is fluidly coupled to the exit conduit 143 through the second conduit 178, the second vertical conduit 134, and the horizontal conduit 135.

The first vertical conduit 131 is configured to direct fluid 148 from the first conduit 176 and into the first portion 137 of the horizontal conduit 135. The second vertical conduit 134 is configured to direct fluid 148 from the second conduit 178 and into the second portion 140 of the horizontal conduit 135. The first portion 137 and the second portion 140 of the horizontal conduit 135 are configured to direct fluid 148 from the first vertical conduit 131 and the second vertical conduit 134, respectively, and into the third portion 141 of the horizontal conduit 135. The third portion 141 of the horizontal conduit 135 is configured to direct fluid 148 from the horizontal conduit 135 and into the exit conduit 143. The exit conduit 143 is configured to exhaust fluid 148 from the first exhaust port 144 and the second exhaust port 145.

Figure 1E:
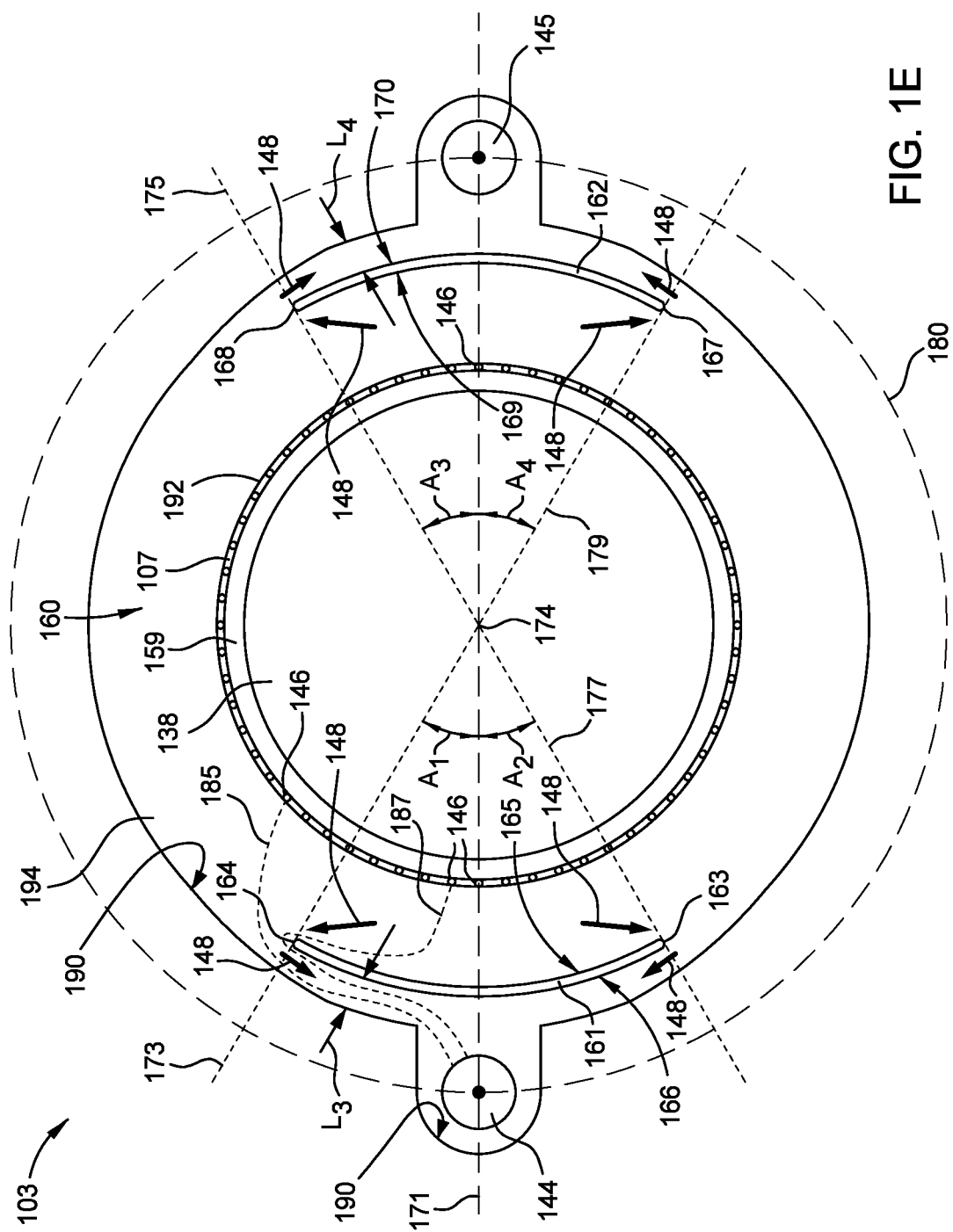
FIG. 1E is a schematic cross-sectional partial view of the pumping device and pedestal illustrated in FIG. 1B, taken along line 1E-1E, according to one implementation.

FIG. 1E is a schematic cross-sectional partial view of the pumping device and pedestal illustrated in FIG. 1B, taken along line 1E-1E, according to one implementation. The first baffle 161 is configured to direct fluid 148 around a first end 163 and a second end 164 of the first baffle 161. Fluid 148 flows within the annulus 105, past a first surface 165, and past a second surface 166 to the first exhaust port 144. In one example the first surface 165 is a concave surface that is disposed to face the inner radial wall 192 of the pumping ring 160. In one example the second surface 166 is a convex surface that is disposed to face the first exhaust port 144.

The second baffle 162 is configured to direct fluid 148 around a first end 167 and a second end 168 of the second baffle 162. Fluid 148 flows within the annulus 105, past a first surface 169, and past a second surface 170 to the second exhaust port 145. In one example, the first surface 169 is a concave surface that is disposed to face the inner radial wall 192 of the pumping ring 160. In one example, the second surface 170 is a convex surface that is disposed to face the second exhaust port 145.

In one embodiment, which can be combined with other embodiments, one or more of the first baffle 161 and/or the second baffle 162 have a curved profile, as illustrated in FIG. 1E.

The first exhaust port 144 and the second exhaust port 145 define a linear axis 171 therebetween. The linear axis 171 is disposed such that it passes through a center of the first baffle 161 and a center of the second baffle 162.

The first baffle 161 is disposed at a first baffle angle $A_1$ and a second baffle angle $A_2$. First baffle angle $A_1$ is measured between the linear axis 171 and a first baffle axis 173. The first baffle axis 173 is linear and passes through the second end 164 of the first baffle 161 and a geometric center 174 of the pumping ring 160. Second baffle angle $A_2$ is measured between the linear axis 171 and a second baffle axis 177 of the first baffle 161. The second baffle axis 177 is linear and passes through the first end 163 of the first baffle 161 and a geometric center 174 of the pumping ring 160.

The second baffle 162 is disposed at a first baffle angle $A_3$ and a second baffle angle $A_4$. First baffle angle $A_3$ is measured between the linear axis 171 and a first baffle axis 175. The first baffle axis 175 is linear and passes through the second end 168 of the second baffle 162 and the geometric center 174 of the pumping ring 160. Second baffle angle $A_4$ is measured between the linear axis 171 and a second baffle axis 179 of the second baffle 162. The second baffle axis 179 is linear and passes through the first end 167 of the second baffle 162 and the geometric center 174 of the pumping ring 160. The linear axis 171 passes through the geometric center 174 of the pumping ring 160.

In one example, a profile of the first baffle 161 and a profile of the second baffle 162 are not parallel to the linear axis 171.

One or more of the first baffle angle $A_1$ of the first baffle 161 and/or the first baffle angle $A_3$ of the second baffle 162 are within a range of about 0.01 degrees to about 90 degrees, such as about 0.01 degrees to about 45 degrees, or about 10 degrees to about 90 degrees. In one example, one or more of the first baffle angle $A_1$ of the first baffle 161 and/or the first baffle angle $A_3$ of the second baffle 162 are 30 degrees, 40 degrees, 45 degrees, or 55 degrees. In one example, one or more of the first baffle angle $A_1$ of the first baffle 161 and/or the first baffle angle $A_3$ of the second baffle 162 are within a range of about 30 degrees to about 55 degrees. In one example, one or more of the first baffle angle $A_1$ of the first baffle 161 and/or the first baffle angle $A_3$ of the second baffle 162 are about 30 degrees.

The second baffle angle $A_2$ of the first baffle 161 is an inverse value of the first baffle angle $A_1$ relative to the linear axis 171. The second baffle angle $A_4$ of the second baffle 162 is an inverse value of the first baffle angle $A_3$ relative to the linear axis 171. As an example where the first baffle angle $A_1$ of the first baffle 161 is 45 degrees and the first baffle angle $A_3$ of the second baffle 162 is 45 degrees, the second baffle angle $A_2$ and the second baffle angle $A_4$ would be −45 degrees, respectively.

In one example, the linear axis 171 passes through the opening 146 nearest to the first baffle 161 and the opening 146 nearest to the second baffle 162.

The first baffle 161 defines a first gap $L_3$ between the second surface 166 and the outer radial wall 190. The second baffle 162 defines a second gap $L_4$ between the second surface 170 and the outer radial wall 190. The first gap $L_3$ is part of a flow path for fluid 148 flowing towards the first exhaust port 144. The first gap $L_3$ has a cross-sectional area. The first exhaust port 144 defines a cross-sectional area through which fluid 148 is exhausted. A ratio of the cross-sectional area of the first exhaust port 144 to the cross-sectional area of the first gap $L_3$ is within a range of 0.5 to 2.0. In one example, the cross-sectional area of the first gap $L_3$ is substantially equal to the cross-sectional area of the first exhaust port 144. The second gap $L_4$ is part of a flow path for fluid 148 flowing towards the second exhaust port 145. The second gap $L_4$ has a cross-sectional area. The second exhaust port 145 defines a cross-sectional area through which fluid 148 is exhausted. A ratio of the cross-sectional area of the second exhaust port 145 to the cross-sectional area of the second gap $L_4$ is within a range of 0.5 to 2.0. In one example, the cross-sectional area of the second gap $L_4$ is substantially equal to the cross-sectional area of the second exhaust port 145.

The first exhaust port 144 and the second exhaust port 145 are disposed at opposite ends of the pumping ring 160. The first exhaust port 144 and the second exhaust port 145 are disposed equidistantly from each other about a circumferential axis 180 of the body 107 of the pumping ring 160. The first exhaust port 144 and the second exhaust port 145 are disposed about a circumferential axis 180 of the body 107 approximately 180 degrees from each other. By disposing the first and second exhaust ports 144, 145 at certain relative locations along the circumferential axis 180, symmetrical exhaustion of gases from the substrate processing chamber 100 and about the substrate 136 is facilitated. Facilitating symmetrical exhaustion of gases about substrates reduces the probability of defects forming on substrates and/or non-uniform processing of substrates.

Although FIGS. 1A-1D illustrate two conduits 176, 178; two vertical conduits 131, 134; and a pumping ring 160 with two exhaust ports 144, 145; the present disclosure contemplates that a larger number of conduits, vertical conduits and/or exhaust ports could be implemented. For example, the pumping ring 160 could have at least three exhaust ports that are fluidly coupled, respectively, to at least three conduits and at least three vertical conduits. A third conduit may be coupled to a third vertical conduit and the third vertical conduit may be coupled to the horizontal conduit 135. The first exhaust port 144, second exhaust port 145, and a third exhaust port could be disposed along the circumferential axis 180 of the body 107 of the pumping ring 160 approximately equidistant from each other, such as 120 degrees from each other.

The configurations of the pumping ring 160, the first baffle 161, and the second baffle 162 facilitate uniform exhaustion of processing gases and facilitate exhausting fluid 148 at substantially equal flow path lengths within annulus 105. For example, the pumping ring 160 exhausts fluid 148 at substantially equal flow path lengths when the fluid 148 enters the annulus 105 through different openings 146 that are disposed at different distances from the respective first exhaust port 144 or second exhaust port 145. Fluid 148 flowing towards the first exhaust port 144 merges adjacent to one of the first end 163 or the second end 164 of the first baffle 161. Fluid 148 flowing towards the second exhaust port 145 merges adjacent to one of the first end 167 or the second end 168 of the second baffle 162. Due to the merging, fluid 148 flowing toward the respective first or second exhaust port 144, 145 has a substantially equal flow path length to fluid 148 that entered the annulus 105 through a different opening 146 when the fluids reach the respective first or second exhaust port 144, 145. As an example, fluid 148 enters the annulus 105 at a first location, and then flows along a first flow path 187. Fluid 148 also enters the annulus 105 at a second location, and then flows along a second flow path 185. The fluid 148 flowing along the first flow path 187 is directed by the first baffle 161 around the first surface 165 and the second end 164. The fluid 148 flowing along the second flow path 185 flows around the second end 164 of the first baffle 161. The fluid 148 flowing along the first flow path 187 enters the annulus 105 at a location that is closer to the first exhaust port 144 than the fluid 148 flowing along the second flow path 185. The length of the first flow path 187 is substantially equal to the length of the second flow path 185, facilitating uniform exhaustion of fluid 148.

Figure 1F:
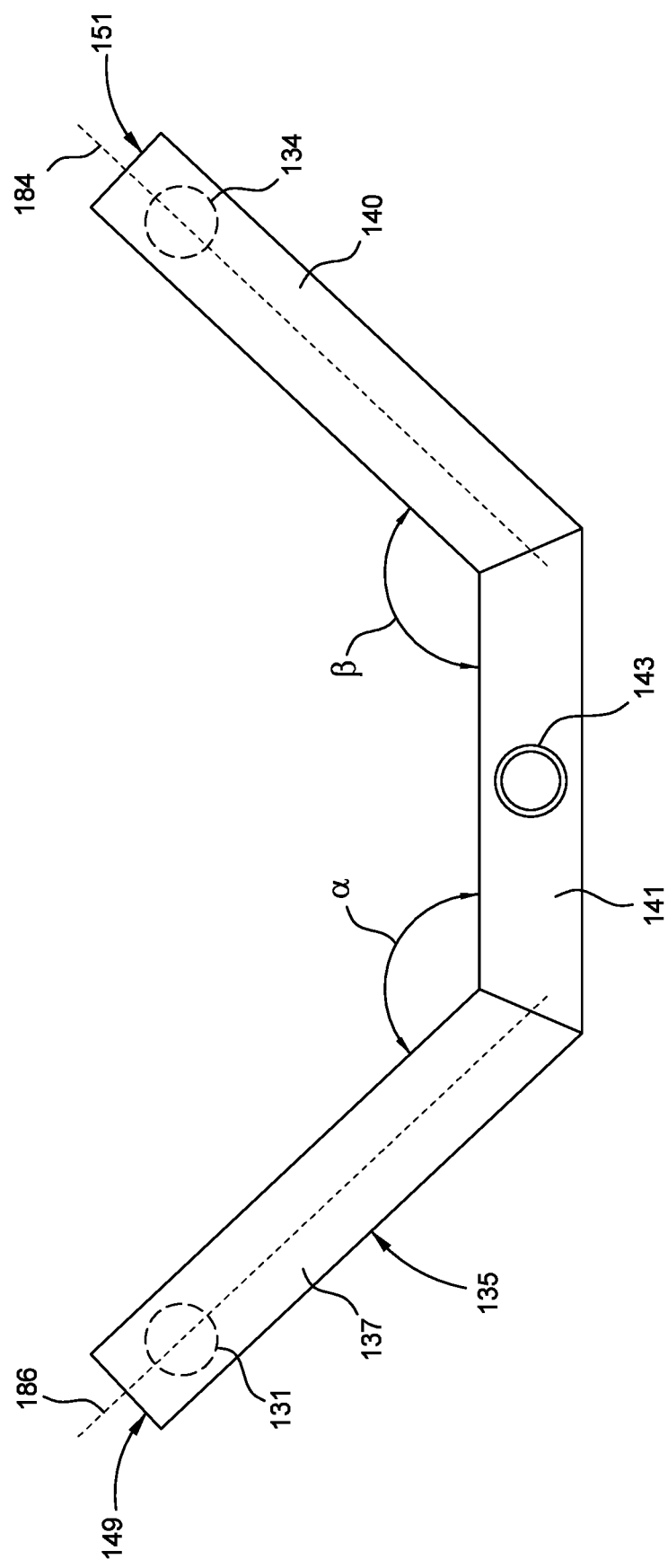
FIG. 1F is a bottom schematic partial view of the pumping device illustrated in FIG. 1D, according to one implementation.

FIG. 1F is a bottom schematic partial view of the pumping device 103 illustrated in FIG. 1D, according to one implementation. The horizontal conduit 135 defines a profile that is in a semi-circular U-shape. In one example, the horizontal conduit 135 defines a profile that is in a V-shape. The first portion 137 and the second portion 140 of the horizontal conduit 135 diverge from the third portion 141. The first portion 137 is disposed at an angle $\alpha$ relative to the third portion 141 and the second portion 140 is disposed at an angle $\beta$ relative to the third portion 141. The first portion 137 is disposed in a first direction 186 and the second portion 140 is disposed in a second direction 184. The first direction 186 is different than the second direction 184. The horizontal conduit 135, the pumping ring 160, the first vertical conduit 131, and the second vertical conduit 134 facilitate a simpler design that does not interfere with other components. For example, the design may not interfere with lifting components that may be disposed underneath or protrude underneath the substrate processing chamber 100 illustrated in FIG. 1A.

A first recursion occurs in the annulus 105 including the first and second baffles 161, 162 and the first and second exhaust ports 144, 145 (illustrated in FIG. 1B). A second recursion occurs in the horizontal conduit 135 that is coupled to the first vertical conduit 131 and the second vertical conduit 134. The first recursion and the second recursion facilitate exhaust path lengths for the fluid 148 that are substantially equal. The fluid 148 exhausted through the first exhaust port 144 merges with fluid 148 exhausted through the second exhaust port 145 in the third portion 141 of the horizontal conduit 135. Upon entering the exit conduit 143 of the foreline 172, fluid 148 has flowed along substantially equal flow path lengths from the one or more openings 146 to the exit conduit 143. Fluid 148 has flowed along substantially equal flow paths lengths even if fluid 148 entered the annulus 105 through different openings 146 and flowed through a different first exhaust port 144 or second exhaust port 145.

Having substantially equal exhaust path lengths facilitates the exhausting of process gases at a uniformity that is near or equal to an apparatus having more than two exhaust ports. The pumping ring 160 promotes equal flow rates of fluids being exhausted from the substrate processing chamber 100. The pumping ring 160 can include two exhaust ports and simulate flow rates of three or more exhaust ports. This configuration promotes flow rates of exhausted fluids and promotes symmetrical exhaustion of gases about substrates. As an example, the configurations described above reduce or eliminate the formation of concentration gradients of fluid 148 in the annulus 105, first conduit 176, second conduit 178, first vertical conduit 131, second vertical conduit 134, and/or the horizontal conduit 135.

Benefits of the present disclosure include symmetrical exhaustion of fluids about substrates, reduced probabilities of substrate defects, facilitated throughput, lower operational time, increased flow rates of exhausted fluids, exhausting fluids along flow paths having substantially equal lengths, exhausting fluids at a uniformity near or equal to an apparatus having more than two exhaust ports, reducing or eliminating the formation of concentration gradients of fluid being exhausted, simpler designs, and designs that reduce or minimize interference with chamber components. Aspects of the present disclosure include a pumping ring; a first baffle; a second baffle; exhaust ports disposed equidistantly from each other; a first conduit; a second conduit; a foreline; a first vertical conduit; a second vertical conduit; a horizontal conduit having a first portion, a second portion, and a third portion; and an exit conduit.

It is contemplated that one or more aspects of the pumping ring and/or one or more aspects of the pedestal, conduits, foreline, vertical conduits, horizontal conduit, and/or exit conduit disclosed herein may be combined. Moreover, the one or more aspects of the pumping ring and/or one or more aspects of the pedestal, conduits, foreline, vertical conduits, horizontal conduit, and/or exit conduit may include some or all of the aforementioned benefits.

While the foregoing is directed to embodiments of the present disclosure, other and further embodiments of the disclosure may be devised without departing from the basic scope thereof. The present disclosure also contemplates that one or more aspects of the embodiments described herein may be substituted in for one or more of the other aspects described. The scope of the disclosure is determined by the claims that follow.

What is claimed is:

1. A pumping ring for substrate processing chambers, comprising:
    an upper wall, a lower wall, an inner radial wall, and an outer radial wall;
    an annulus defined by the upper wall, the lower wall, the inner radial wall, and the outer radial wall;
    a first exhaust port in the lower wall that is fluidly coupled to the annulus;
    a second exhaust port in the lower wall that is fluidly coupled to the annulus, the first exhaust port and the second exhaust port defining a linear axis therebetween;
    a first baffle disposed in the annulus adjacent to the first exhaust port; and
    a second baffle disposed in the annulus adjacent to the second exhaust port, the first baffle and the second baffle disposed at a baffle angle measured between an end of the respective first or second baffle and the linear axis, wherein the baffle angle is within a range of about 0.01 degrees to about 55 degrees.

2. The pumping ring of claim 1, further comprising one or more openings that are configured to direct a fluid into the annulus, wherein the first exhaust port and the second exhaust port are fluidly coupled to a foreline.

3. The pumping ring of claim 1, wherein the first baffle and the second baffle are both curved.

4. The pumping ring of claim 1, wherein the baffle angle of the first baffle and the second baffle is within a range of about 30 degrees to about 55 degrees.

5. The pumping ring of claim 4, wherein the baffle angle of the first baffle and the second baffle is about 30 degrees.

6. The pumping ring of claim 5, wherein the first exhaust port and the second exhaust port are disposed equidistantly from each other about a circumferential axis of the pumping ring.

7. The pumping ring of claim 1, wherein the first baffle and the second baffle are configured to direct a fluid around a first end and a second end of each respective first baffle and second baffle.

8. The pumping ring of claim 7, the fluid comprising a processing gas and a processing residue.

9. A pumping ring for substrate processing chambers, comprising:
- a top surface, an upper wall, a lower wall, an inner radial wall, and an outer radial wall;
- one or more openings configured to direct a fluid therethrough;
- a first exhaust port;
- a second exhaust port, the first exhaust port and the second exhaust port defining a linear axis therebetween;
- a first baffle disposed adjacent the first exhaust port; and
- a second baffle disposed adjacent the second exhaust port, the first baffle and the second baffle disposed at a baffle angle measured between an end of the respective first or second baffle and the linear axis, wherein the baffle angle is within a range of about 0.01 degrees to about 55 degrees.

10. The pumping ring of claim 9, wherein the first exhaust port and the second exhaust port are disposed equidistantly from each other about a circumferential axis of the pumping ring.

11. The pumping ring of claim 9, wherein the baffle angle of the first baffle and the second baffle is within a range of about 30 degrees to about 55 degrees.

12. A substrate processing chamber, comprising:
- a chamber body;
- a pedestal disposed in the chamber body;
- a pumping ring disposed around the pedestal, the pumping ring comprising an upper wall, a lower wall, an inner radial wall, and an outer radial wall;
- an annulus defined by the upper wall, the lower wall, the inner radial wall, and the outer radial wall;
- a first exhaust port in the pumping ring that is fluidly coupled to the annulus;
- a second exhaust port in the pumping ring that is fluidly coupled to the annulus, the first exhaust port and the second exhaust port defining a linear axis therebetween;
- a first baffle disposed in the annulus adjacent the first exhaust port; and
- a second baffle disposed in the annulus adjacent the second exhaust port, the first baffle and the second baffle disposed at a baffle angle measured between an end of the respective first or second baffle and the linear axis, wherein the baffle angle is within a range of about 0.01 degrees to about 55 degrees; and
- a foreline that is fluidly coupled to the first exhaust port and the second exhaust port.

13. The substrate processing chamber of claim 12, wherein the first exhaust port and the second exhaust port are disposed about a circumferential axis of the pumping ring approximately 180 degrees from each other.

14. The substrate processing chamber of claim 12, the pumping ring further comprising one or more openings that are configured to direct a fluid from an internal volume of the chamber body to the annulus.

15. The substrate processing chamber of claim 14, the fluid comprising a processing gas and a processing residue.

16. The substrate processing chamber of claim 12, wherein the first exhaust port is fluidly coupled to the foreline through a first vertical conduit and a horizontal conduit, and the second exhaust port is fluidly coupled to the foreline through a second vertical conduit and the horizontal conduit.

17. The substrate processing chamber of claim 16, the horizontal conduit comprising a first portion that is coupled to the first vertical conduit, a second portion that is coupled to the second vertical conduit, and a third portion that is coupled to the foreline, wherein the first portion and the second portion diverge from the third portion at a first oblique angle and a second oblique angle.

18. The substrate processing chamber of claim 17, wherein the first vertical conduit is fluidly coupled to the first exhaust port through a first conduit in the chamber body, the second vertical conduit is fluidly coupled to the second exhaust port through a second conduit in the chamber body, and the foreline is configured to exhaust a fluid from the first exhaust port and the second exhaust port.

19. The substrate processing chamber of claim 17, wherein the horizontal conduit comprises a first end adjacent to the first vertical conduit, and a second end adjacent to the second vertical conduit.

20. The pumping ring of claim 9, wherein the one or more openings are oriented at an angle relative to an axis parallel to the linear axis, and the angle is within a range of 0.01 degrees to 90 degrees.

* * * * *